United States Patent [19]

Chen et al.

[11] Patent Number: 5,166,557
[45] Date of Patent: Nov. 24, 1992

[54] GATE ARRAY WITH BUILT-IN PROGRAMMING CIRCUITRY

[75] Inventors: Kueing-Long Chen, Plano; David K. Liu, Dallas, both of Tex.

[73] Assignee: Texas Instruments Incorporated, Dallas, Tex.

[21] Appl. No.: 636,818

[22] Filed: Jan. 2, 1991

[51] Int. Cl.⁵ .................. H03K 19/02; H03K 19/094
[52] U.S. Cl. ........................ 307/468; 307/465.1; 307/303; 307/482.1; 307/296.1
[58] Field of Search ............... 307/468, 296.1, 304, 307/303, 465, 465.1, 482.1; 361/56, 117; 357/23.13

[56] References Cited
U.S. PATENT DOCUMENTS

| | | | |
|---|---|---|---|
| 4,423,431 | 12/1983 | Sasaki | 307/304 |
| 4,703,206 | 10/1987 | Cavlan | 307/202.1 |
| 4,785,199 | 11/1988 | Kolodny et al. | 307/202.1 |
| 4,859,874 | 8/1989 | Bosnyak | 307/202.1 |
| 4,952,994 | 8/1990 | Lin | 361/56 |
| 4,990,802 | 2/1991 | Smooha | 307/482.1 |
| 5,017,985 | 5/1991 | Lin | 361/56 |

Primary Examiner—Edward P. Westin
Assistant Examiner—Richard Roseen
Attorney, Agent, or Firm—B. Peter Barndt; Richard L. Donaldson

[57] ABSTRACT

A field programmable gate array having anti-fuse crosspoints. The input and output circuits of the gate array are especially designed so that the low voltage logic modules are not affected by high programming voltages. Each logic module is designed to be part of the programming circuit, rather than being isolated from it.

15 Claims, 3 Drawing Sheets

GATE ARRAY WITH BUILT-IN PROGRAMMING CIRCUITRY

TECHNICAL FIELD OF THE INVENTION

This invention relates to electronic circuits, and more particularly to a field programmable gate array with anti-fuse connections.

BACKGROUND OF THE INVENTION

Field programmable gate arrays are a type of programmable logic device, having a programmable array of logic modules. Each logic module is comprised of at least one logic gate. These logic modules are interconnected with a matrix of conductive lines, which intersect at crosspoints that may be selectively made conductive or nonconductive during a programming process. For example, if a connection is not wanted at a certain crosspoint, a fuse at the crosspoint is blown. By programming the interconnections among the logic cells, the gate array is made to realize a desired logical function.

A recent development in programmable gate arrays is the use of anti-fuses instead of fuses at the crosspoints. The devices are programmed by applying a voltage to close electrical connections. Usually, the voltages used for the programming inputs are high in relation to the voltage required for operation after programming.

A problem with programming anti-fuses of gate arrays is that the higher programming voltage inputs must be isolated from the lower voltage circuits of the logic portions of the gate array. One approach to achieving such isolation is to interpose isolation transistors between each logic module and its associated anti-fuses. These isolation transistors are usually large and thus require extra space on the chip.

SUMMARY OF THE INVENTION

One aspect of the invention is a logic module for a field programmable gate array having anti-fuse crosspoints. An output circuit is directly connected to an output node of the logic module, and is configured as a pull-up circuit having two N-channel metal oxide silicon transistors. The output node is used to connect the output circuit to anti-fuse crosspoints. An input circuit is directly connected to an input node of the logic module, and has two high-voltage transistors in a totem pole configuration. The input node is used to connect the input circuit to anti-fuse crosspoints. The input circuit and output circuit are configured so that programming voltages may be applied to the crosspoints without damage to the logic circuits of the logic module.

A technical advantage of the invention is that it eliminates the need for an isolation transistor of a field programmable gate array device. At the same time, the fuse specification is reduced, and a lower voltage swing increases speed and decreases power consumption of these devices.

DETAILED DESCRIPTION OF THE INVENTION

Figure 1:
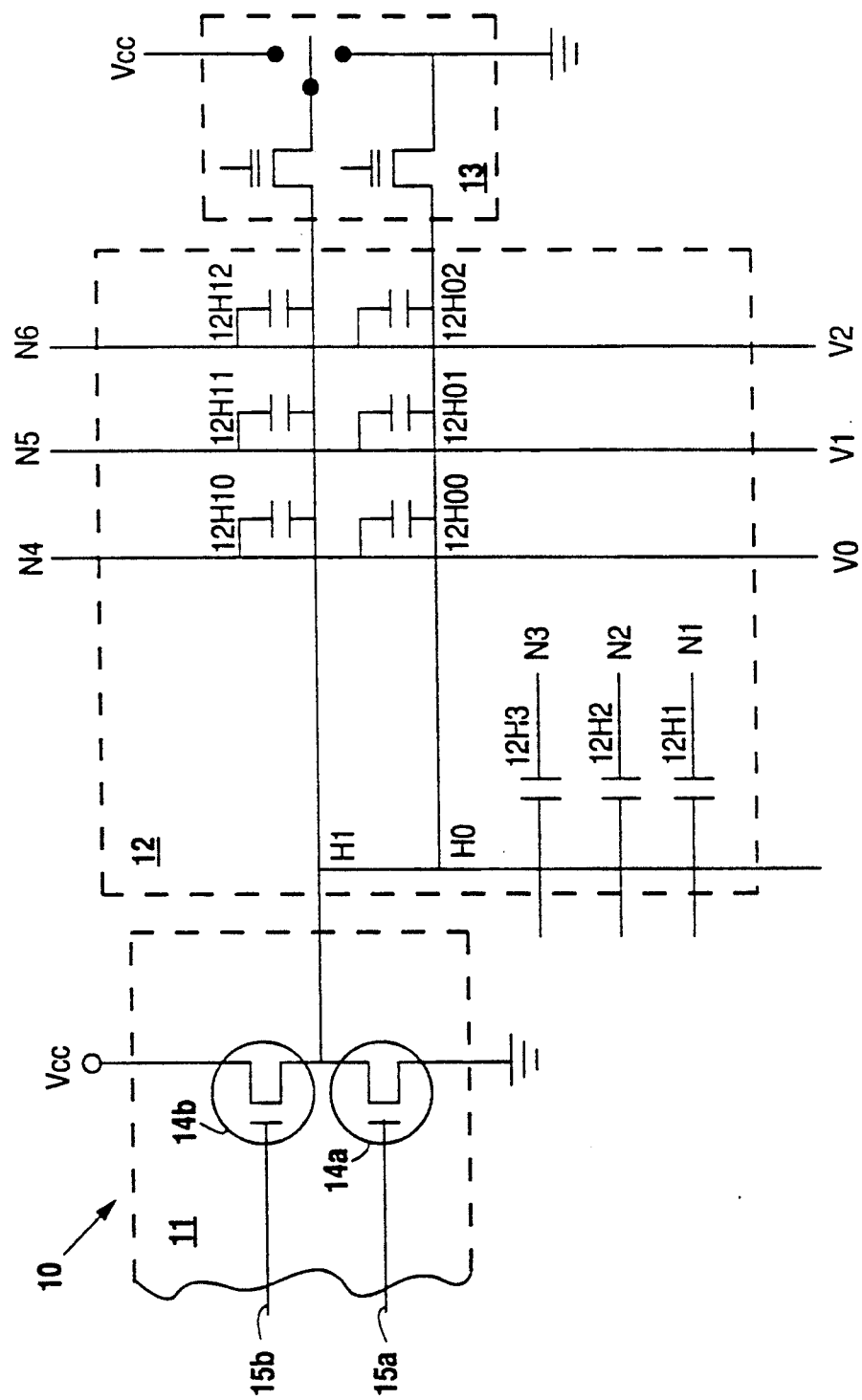
FIG. 1 is a block diagram of output node of a logic module and an array of anti-fuse crosspoints.
Figure 2:
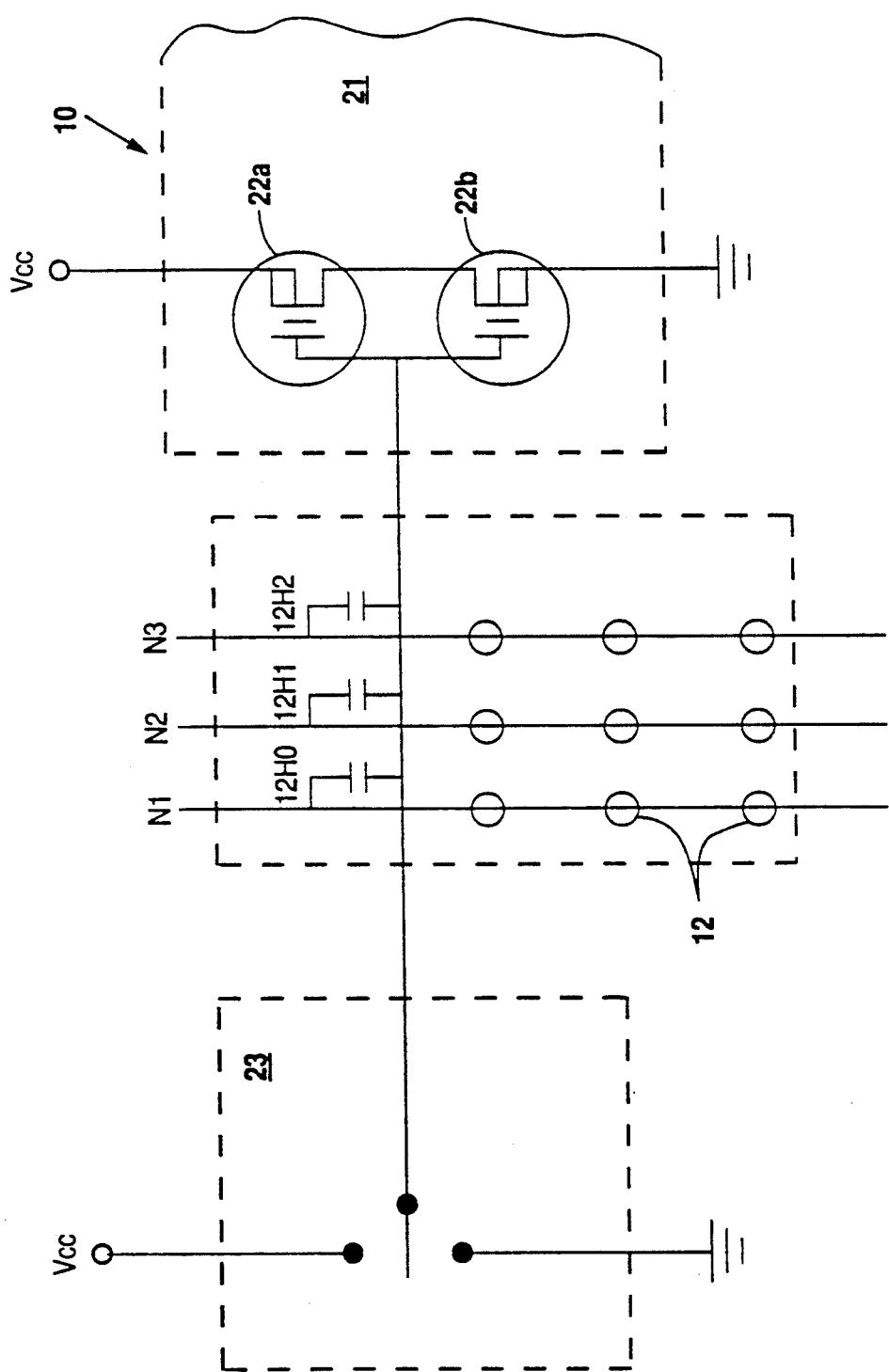
FIG. 2 is a block diagram of the input end of a logic module and an array of anti-fuse crosspoints.

FIGS. 1 and 2 illustrate an output circuit 11 and an input circuit 21 of a logic module 10, respectively, and related anti-fuses 12 and interconnection lines. Anti-fuses 12 are manufactured as open gaps, but are programmed in the manner explained below. Unprogrammed anti-fuses 12 are also represented as crosspoints.

Figure 3:
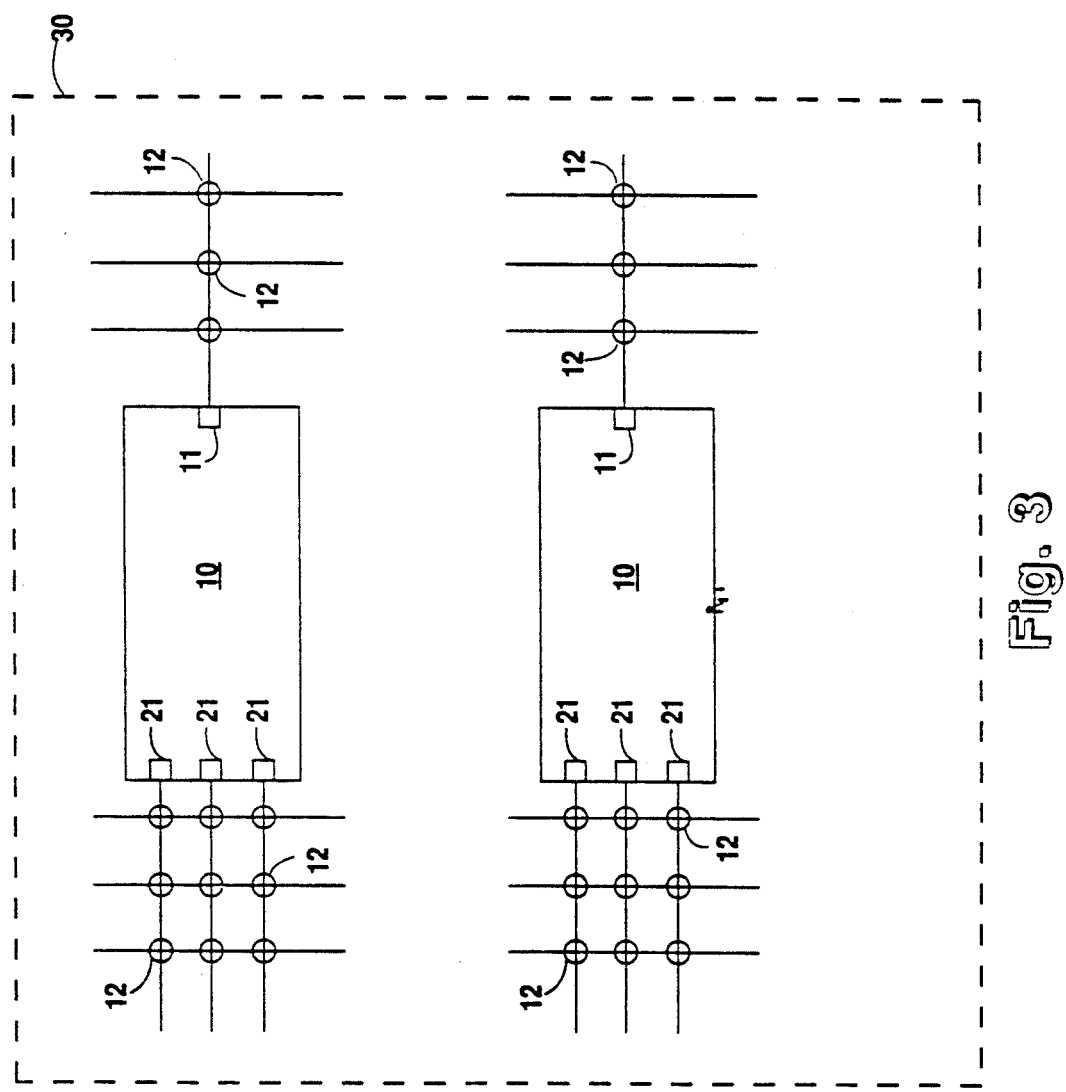
FIG. 3 illustrates how a number of logic modules and anti-fuse crosspoints may be interconnected to form a programmable gate array.

FIG. 3 illustrates how logic module 10, anti-fuses 12, and the interconnection lines are part of a larger array 30, which may contain any number of logic modules 11 and anti-fuses 12. Thus, logic module 10 and anti-fuses 12 may be generally described as being part of a field programmable gate array. The process of closing the gaps of a selected anti-fuse 12 is herein referred to as "programming" the anti-fuse 12.

Logic module 10 can be any circuit used to realize one or more logic gates. Each logic module 10 may have more than one output circuit 11 or input circuit 21, such as are shown in FIGS. 1 and 2. The gates realized by logic module 10 may be specific logic gates, such as AND or OR gates or their complements. Alternatively, logic module 10 may be "universal" in the sense that it is capable of realizing $2^n$ functions of n independent binary input variables. These various forms of logic module 10 are commercially available.

A feature of the invention is that, because of the configuration of the input and output circuits of logic module 10, the programming circuit includes logic module 10. As explained below, special transistors, combined with a particular range of programming voltages, eliminate the need for isolation transistors.

Each anti-fuse 12 is associated with a programming input circuit, N, which may be connected to a programming voltage, Vpp, if that anti-fuse 12 is to be programmed. The value of Vpp is typically about twice the operational voltage of the gate array after programming, Vcc. However, as explained below, the value of Vpp is limited by other features of the invention. For purposes of example herein, Vcc is assumed to be Vpp/2. In the programming methods described below, each node N is connected to Vcc when the corresponding anti-fuse 12 is not to be programmed.

FIG. 1 is a block diagram of an output circuit 11 of a logic module 10, its associated anti-fuses 12, and a programming switch 13. Two horizontal interconnection lines, H0 and H1, and three vertical lines, V0–V2, are available to connect logic module 10 to other logic modules 10.

Output circuit 11 serves as the input node to logic module 10. It is a pull-up circuit, comprised of two NMOS transistors 14a and 14b. NMOS transistors 14a and 14b are metal-oxide-silicon unipolar transistors having a negatively charged semiconductor channel.

The on/off conditions of NMOS transistors 14a and 14b are controlled by two control lines 15a and 15b. These control lines 15a and 15b carry control signals used during programming of the gate array, as explained below.

For purposes of example, FIG. 1 shows three horizontal anti-fuses 12H0–12H2, and a 2×3 array of vertical anti-fuses 12V00–12V22. However, a different number of anti-fuses 12 could be used. The number and arrangement of anti-fuses 12 associated with each logic module 10 depends on the interconnections to be made available to other logic modules 10 of the gate array 30.

To program one of the horizontal anti-fuses 12H0–12H2, line 15a is high so that transistor 14a is on, and line 15a is low so that transistor 14b is off. The corresponding node of the anti-fuse to be programmed is at Vpp. For example, if fuse 12H2 is to be programmed, N2 is at Vpp.

If none of the horizontal anti-fuses 12 is to be programmed, line 15a is low and line 15b is high, so that transistors 14a and 14b are off and on, respectively. Thus, the maximum voltage across horizontal anti-fuses 12 is Vcc, which is insufficient to program them.

To program one of the vertical anti-fuses, 12V00–12V22, line 15a is high and line 15b is low so that transistors 14a and 14b are on and off, respectively. The corresponding node N of the anti-fuse 12 to be programmed is at Vpp. For example, if anti-fuse 12V11 is to be programmed, nodes N4 and N6 are at Vcc and node N5 is at Vpp.

If none of the vertical anti-fuses 12 is to be programmed, line 15a is low and line 15b is high, so that transistors 14a and 14b are off and on, respectively. Thus, the voltage across vertical anti-fuses 12 is approximately $Vcc-V_T$, which keeps them from being programmed.

Another approach to programming is to tri-state the output circuit 11 and use programming switch 13 to program anti-fuses 12. Programming switch 13 is used to switch from Vcc to ground. If switch 13 is set at ground, the selected anti-fuse will be programmed, otherwise it will not. For programming, the node N associated with the anti-fuse to be programmed is set to Vpp.

When the output of input circuit 11 is tri-stated for programming, Vpp must be less than the breakdown voltage of transistors 14a and 14b. In other words, anti-fuses 12 and transistors 14a and 14b must be selected so that their breakdown voltage is less than the voltage needed to program the anti-fuses 12. For example, if the breakdown voltage of transistors 14a and 14b is 12 volts, Vpp cannot exceed 12 volts and Vcc (Vpp/2) is equal to or less than 6 volts. Thus, the programming range of anti-fuses 12 must be above 6 volts and less than 12 volts.

FIG. 2 is a block diagram of the input circuit 21 of a logic module 10, and associated anti-fuses 12 and interconnection lines. Again, the particular number of anti-fuses 12 associated with a particular input circuit 21 is a design choice.

Input circuit 21 serves as the input node for logic module 10, and is comprised of two high-voltage transistors 22a and 22b. In the preferred embodiment, the high voltage characteristic of transistors 22a and 22b is implemented with thick oxide. For example, for a programming voltage Vpp of 12 volts, the range of oxide thickness is approximately 250 to 300 angstroms. Transistors 22a and 22b can have a $V_T$ of approximately 1.6 volts to receive a 3.5 volt logic high signal from the output of previous stages, for zero through current.

Programming switch 23 is used in a manner similar to programming switch 13 of FIG. 1. For programming, switch 23 is used to connect the interconnection line H to ground. For example, to program anti-fuse 12H1, node N2 is connected to Vpp. Nodes N1 and N3 are at the operational voltage Vcc.

Although the invention has been described with reference to specific embodiments, this description is not meant to be construed in a limiting sense. Various modifications of the disclosed embodiments, as well as alternative embodiments will be apparent to persons skilled in the art. It is, therefore, contemplated that the appended claims will cover all modifications that fall within the true scope of the invention.

What is claimed is:

1. A logic module for a field programmable gate array having anti-fuse crosspoints, comprising:
    an output circuit configured as a pull-up circuit having two N-channel metal oxide silicon transistors, wherein said output circuit has at least one connection point for connecting said n-channel transistors to anti-fuse crosspoints; and
    an input circuit having two high voltage transistors in a totem pole configuration, wherein said input circuit has at least one connection point for connecting said high voltage transistors to anti-fuse crosspoints.

2. The logic module of claim 1, wherein said input circuit transistors are thick oxide transistors.

3. The logic module of claim 1, wherein said output circuit and said input circuit are capable of receiving a programming voltage of approximately twice the operational voltage at said connection points.

4. The logic module of claim 3, wherein said programming voltage is less than the breakdown voltage of said transistors of said output circuit.

5. A field programmable gate array, comprising:
    a number of logic modules, each logic module having an output circuit configured as a pull-up circuit having two N-channel metal oxide silicon transistors, wherein said output circuit has at least one connection point for connecting said N-channel transistors to anti-fuse crosspoints, and each logic module having an input circuit having tow high voltage transistors in a totem pole configuration, wherein said input circuit has at least one connection point for connecting said high voltage transistors to anti-fuse crosspoints;
    an array of anti-fuse crosspoints; and
    a matrix of interconnection lines for connecting said logic modules via said anti-fuse crosspoints.

6. The gate array of claim 5, and further comprising a programming switch for switching between a programming voltage and ground.

7. The logic module of claim 5, wherein said input circuit transistors are thick oxide transistors.

8. The logic module of claim 5, wherein said output circuit and said input circuit are capable of receiving a programming voltage of approximately twice the operational voltage at said connecting points.

9. The logic module of claim 8, wherein said programming voltage is less than the breakdown voltage of said transistors of said output circuit.

10. A method of programming a field programmable gate array, comprising the steps of:
    connecting logic module outputs to anti-fuse crosspoints, using a pull-up circuit having two N channel metal-oxide-silicon transistors at the output node;
    connecting logic module inputs to anti-fuse crosspoints, using a two-transistor totem pole circuit having two high-voltage transistors at the input node; and
    interconnecting said logic modules by applying a programming voltage across a selected one of said anti-fuse crosspoints, wherein said programming voltage is also across said output node and said input node.

11. The method of claim 10, wherein said programming voltage is approximately twice the operational voltage of said logic modules.

12. The method of claim 10, wherein said programming voltage is less than the breakdown voltage of said N channel transistors of said output circuit.

13. The method of claim 10, wherein said step of applying a programming voltage comprises tri-stating said transistors of said output circuit and making a connection to ground on one side of said crosspoint.

14. The method of claim 10, wherein said step of applying a programming voltage comprises switching said transistors of said output circuit, using a control signal, such that one transistor is off and one is on, thereby making a connection to ground on one said of said crosspoint.

15. The method of claim 10, wherein said step of applying a programming voltage comprises connecting one side of said crosspoint to ground such that said programming voltage is across said crosspoint and at said input node.

* * * * *